United States Patent
Yamashita

(10) Patent No.: US 9,973,192 B2
(45) Date of Patent: May 15, 2018

(54) LIQUID CRYSTAL DRIVE CIRCUIT AND LIQUID CRYSTAL DRIVE CIRCUIT CONTROL METHOD

(71) Applicant: LAPIS SEMICONDUCTOR CO., LTD., Kanagawa (JP)

(72) Inventor: Takashi Yamashita, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days. days.

(21) Appl. No.: 15/433,189

(22) Filed: Feb. 15, 2017

(65) Prior Publication Data
US 2017/0162132 A1    Jun. 8, 2017

Related U.S. Application Data

(63) Continuation of application No. 15/081,154, filed on Mar. 25, 2016, now Pat. No. 9,595,965.

(30) Foreign Application Priority Data

Mar. 26, 2015 (JP) .................................. 2015-065016

(51) Int. Cl.
*H03K 19/0185* (2006.01)
*G09G 3/36* (2006.01)

(52) U.S. Cl.
CPC ............... *H03K 19/018507* (2013.01); *H03K 19/01855* (2013.01); *G09G 3/36* (2013.01); *G09G 2310/08* (2013.01)

(58) Field of Classification Search
CPC ........... G09G 2310/08; H03K 19/0175; H03K 19/0185; H03K 19/018507; H03K 19/01855

USPC .......... 326/62, 80, 81, 82, 83; 327/108, 109, 327/111, 112, 333

See application file for complete search history.

(56) References Cited

U.S. PATENT DOCUMENTS 7,282,952 B2 * 10/2007 Oka ..................... G09G 3/3677
326/63
2008/0036529 A1  2/2008 Ishiyama
2009/0009510 A1  1/2009 Shu et al.
2011/0199397 A1  8/2011 Ko et al.

FOREIGN PATENT DOCUMENTS

JP        2013-041029 A       2/2013

* cited by examiner

*Primary Examiner* — William Hernandez
(74) *Attorney, Agent, or Firm* — Volentine, Whitt & Francos, PLLC

(57) ABSTRACT

There is provided a semiconductor device including (1) a first power source section that includes a first power source output terminal and a second power source output terminal that output voltages at mutually different voltage levels, (2) a first output section that includes a first output stage switch that is provided between the first power source output terminal and a first voltage output terminal, and a second output stage switch that is provided between the second power source output terminal and the first power source output terminal, and (3) a controller that performs ON/OFF control of the first output stage switch and the second output stage switch such that both the first output stage switch and the second output stage switch are in an OFF state over a predetermined period encompassing a point in time when a signal level of the first signal switches.

3 Claims, 9 Drawing Sheets

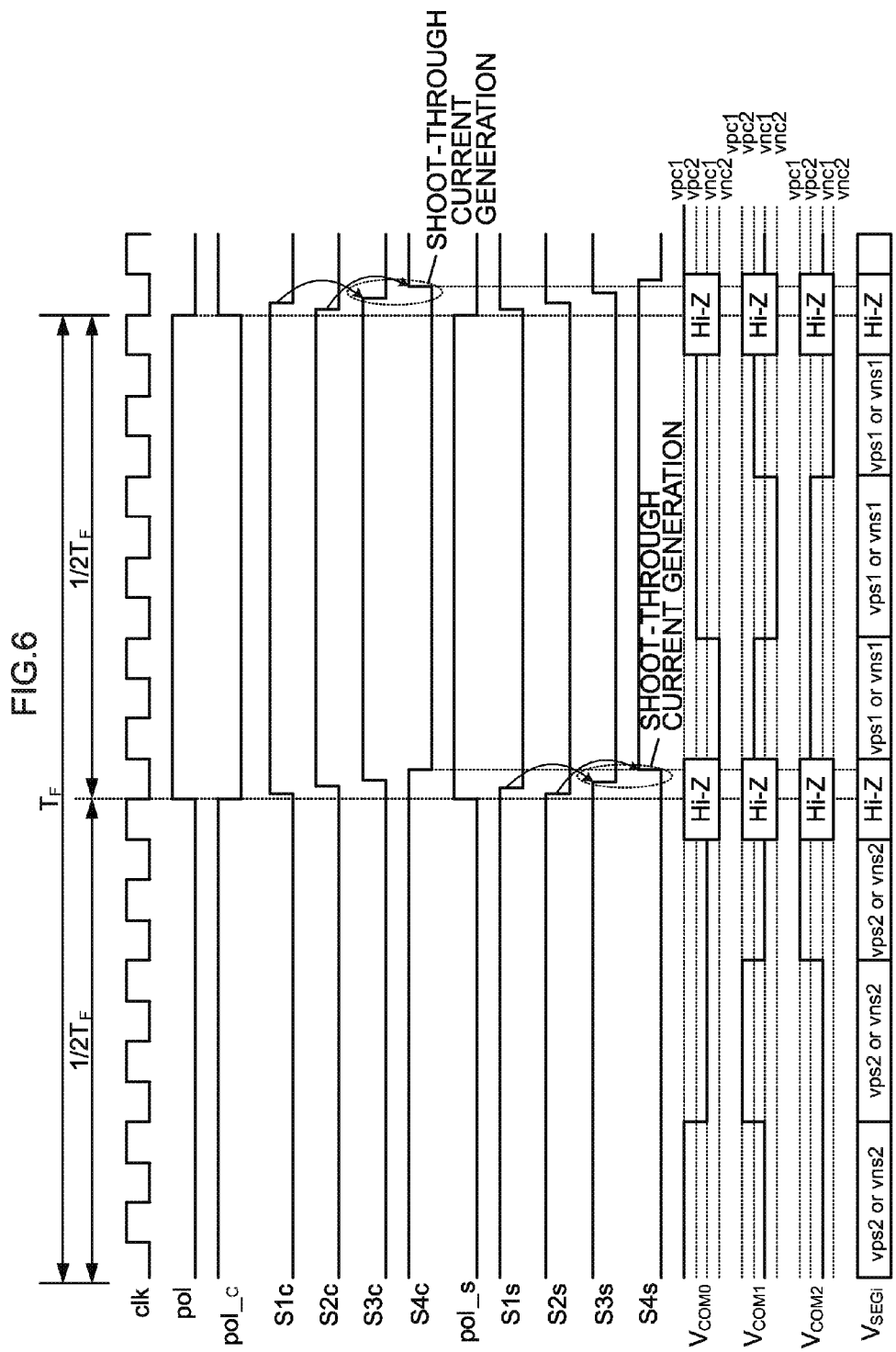

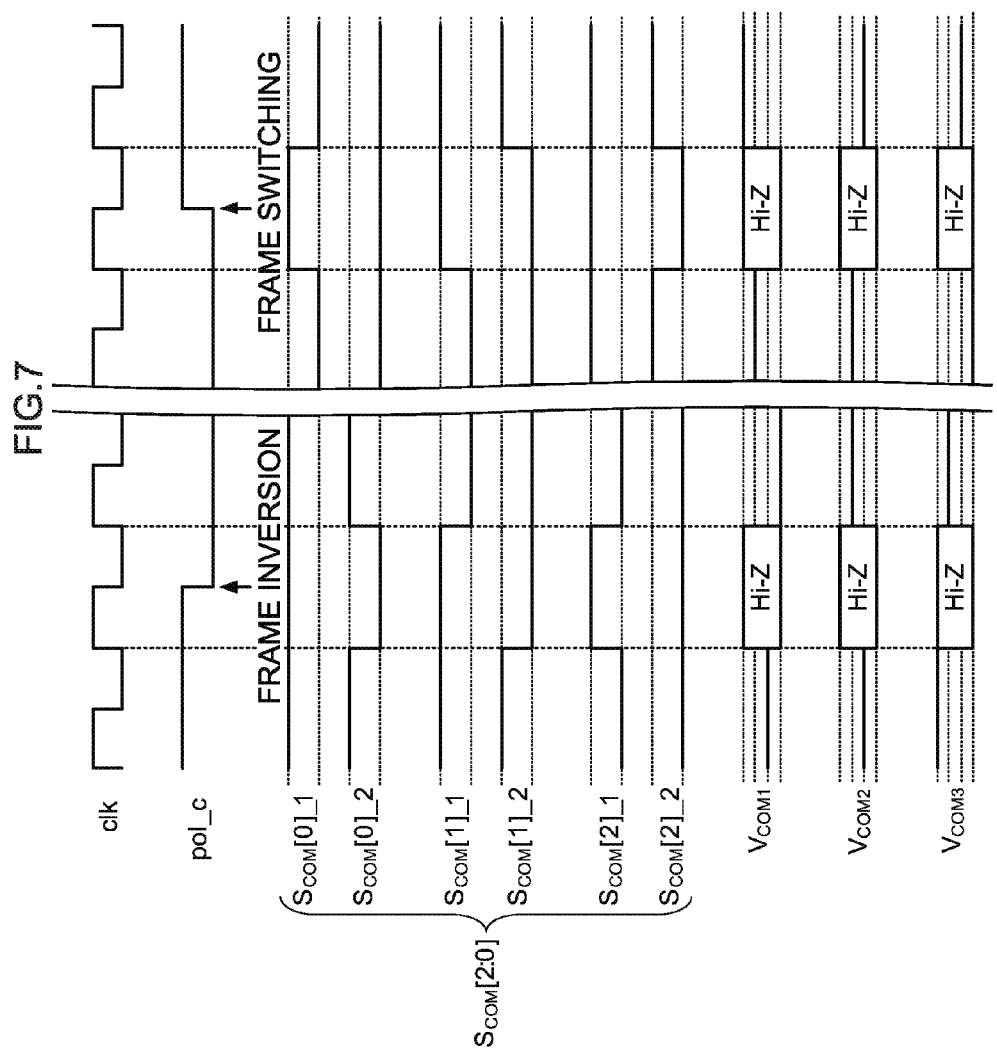

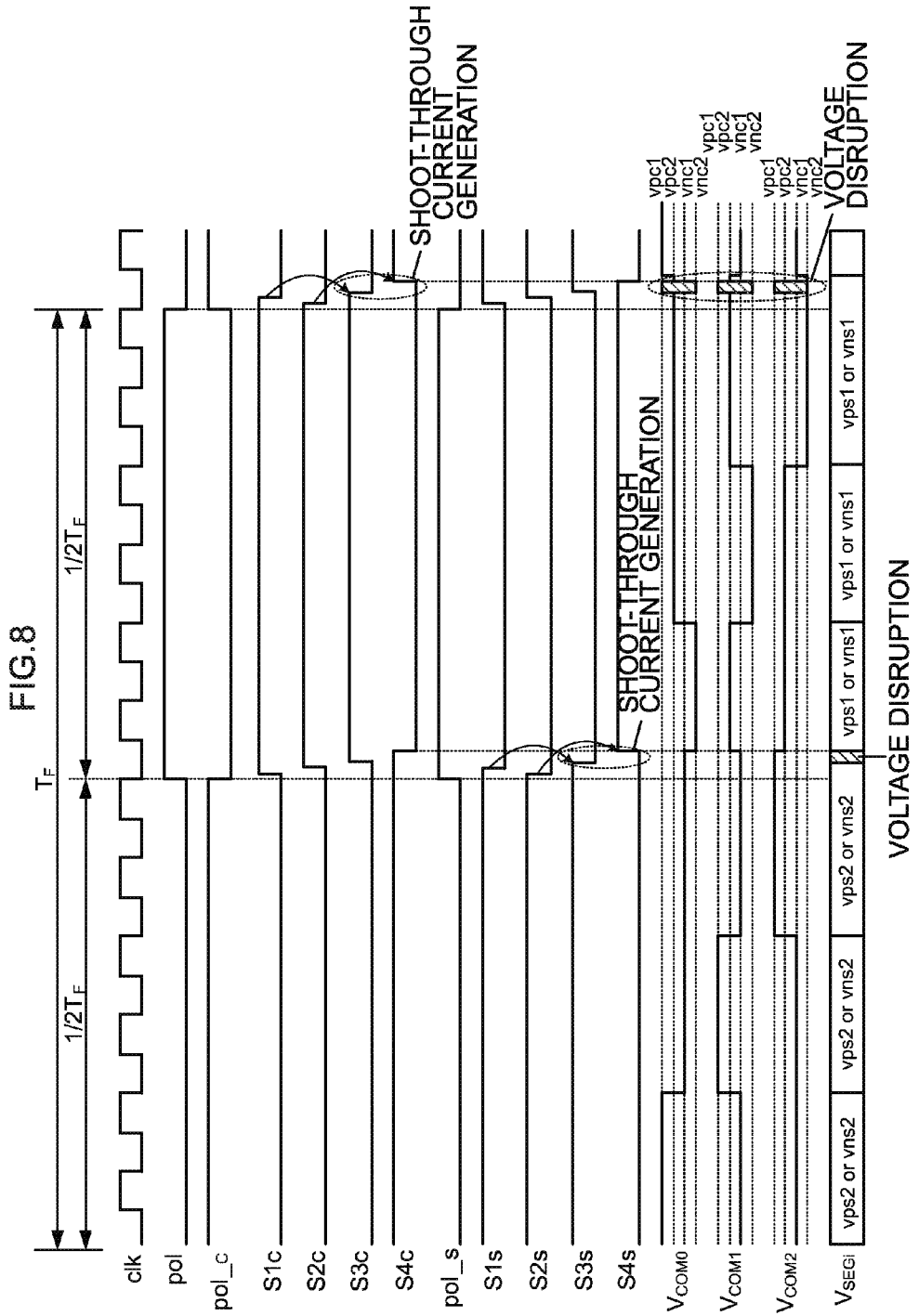

LIQUID CRYSTAL DRIVE CIRCUIT AND LIQUID CRYSTAL DRIVE CIRCUIT CONTROL METHOD

CROSS-REFERENCE TO RELATED APPLICATION

This application is a continuation application of application Ser. No. 15/081,154, filed on Mar. 25, 2016, This application claims priority under 35 USC 119 from Japanese Patent Application, No. 2015-065016, filed on Mar. 26, 2015, the disclosure of which is incorporated by reference herein.

BACKGROUND

Technical Field

The present disclosure relates to a semiconductor device and a semiconductor device control method.

Related Art

As a drive method for a liquid crystal panel including plural segment electrodes and plural common electrodes arrayed in a lattice formation, a matrix drive method is known in which common electrodes are selected in sequence by applying a scanning voltage sequentially to the plural common electrodes, and a signal voltage is applied to the segment electrodes connected to the pixels desired to be switched ON, from out of the pixels connected to the selected common electrode. Moreover, a 1/S bias drive method is known in which the level of voltage applied to the common electrodes and the segment electrodes is changed in plural steps. Known technology related to a liquid crystal drive circuit for driving a liquid crystal panel using such a drive method includes the following example.

For example, Japanese Patent Application Laid-Open (JP-A) No. 2013-41029 describes a liquid crystal drive circuit including a common signal output circuit that supplies a common signal taking, in a predetermined sequence, a first potential, a second potential, or an intermediate potential, to common electrodes of a liquid crystal panel, and including a segment signal output circuit that supplies a segment signal taking, according to the common signal, a first potential, a second potential, or an intermediate potential, to segment electrodes of the liquid crystal panel. In such a liquid crystal drive circuit, the segment signal output circuit increases the impedance of the segment signal only for a first period when the segment signal output circuit is switching the potential of the segment signal.

In a case in which a liquid crystal panel is driven by 1/S bias, the voltage levels of the common voltage applied to the common electrodes and of the segment voltage applied to the segment electrodes are changed in (S+1) steps. Thus in a liquid crystal drive circuit that drives the liquid crystal panel using 1/S bias driving, the voltage level of output voltage is appropriately changed in a power source section that outputs a power source voltage for generating the common voltage and the segment voltage.

However, it is known that in a liquid crystal panel, in a case in which unevenness occurs in the direction of the electrical field applied to the liquid crystal elements, the liquid crystal elements deteriorate under the action of electrolysis and the like. Thus in a liquid crystal drive circuit, in order that unevenness does not occur in the direction of the electrical field applied to the liquid crystal elements, frame inversion is performed in which the magnitude relationship between the voltage applied to the common electrodes and the voltage applied to the segment electrodes is inverted between a front half period and a rear half period of a single frame, while pixels maintain a switched ON state.

A power source section of a liquid crystal drive circuit that drives a liquid crystal panel using a 1/S bias drive method switches the voltage level of the output voltage during frame inversion. Switching the output voltage of the power source section is performed, for example, by employing plural switches provided between each of the power source lines of mutually different voltage levels, and the output terminal. However, shoot-through current flows between the power source lines in a case in which a period arises in which plural of the switches adopt an ON state at the same time. Disruption to the voltage levels of the common voltage and the segment voltage arises as a result, and abnormal display, such as flickering, may be generated in the liquid crystal panel. In order to prevent the generation of such shoot-through current, a timing regulation circuit is employed so as to switch a switch connected to one power source line ON, only when the switch connected to another power source line has been switched OFF.

However, due to recent demands for lower voltages for semiconductor devices, it is becoming difficult to completely prevent the generation of such shoot-through current using a timing regulation circuit. Namely, in cases in which the power source voltage supplied to a semiconductor device has been lowered, the lag time caused by the slew rate, the wiring line length, and the capacity load etc. of the circuit formed by the semiconductor device becomes significant, and either the timing regulation circuit ceases to function appropriately, or the circuit does not operate at the intended timing due to the influence of the lag time generated in at a stage after the timing regulation circuit.

To address this issue, conceivably circuit simulation could be employed to design a circuit that takes into consideration the influence of lag time when at low voltage. However, the precision of circuit simulation is low in low voltage regions (for example, 1V or lower), requiring considerable man-hours and cost for validation operations on the circuit design. Due to lowering the voltages of semiconductor devices, it is accordingly difficult to prevent the generation of shoot-through current in a liquid crystal drive circuit, and there is a need for new technology to suppress the generation of abnormal display caused by shoot-through current in a liquid crystal panel.

SUMMARY

In consideration of the above circumstances, the present disclosure provides a semiconductor device and semiconductor device control method that are capable of suppressing generation of abnormal display caused by shoot-through current.

A first aspect of the present disclosure is a semiconductor device including: a first power source section that includes a first power source output terminal and a second power source output terminal that output voltages at mutually different voltage levels, the first power source section changing the respective voltage levels output from the first power source output terminal and the second power source output terminal according to switching of a signal level of a first signal; a first output section that includes a first output stage switch that is provided between the first power source output terminal and a first voltage output terminal, and a second output stage switch that is provided between the second power source output terminal and the first power source output terminal; and a controller that performs ON/OFF control of the first output stage switch and the second output stage switch such that both the first output stage switch and the second output stage switch are in an OFF state over a predetermined period encompassing a point in time when a signal level of the first signal switches.

A second aspect of the present disclosure is a control method of a semiconductor device including a power source section that includes a first power source output terminal and a second power source output terminal that output voltages at mutually different voltage levels, the power source section changing the respective voltage levels output from the first power source output terminal and the second power source output terminal according to switching of a signal level of a first signal, and an output section that includes a first output stage switch that is provided between the first power source output terminal and a voltage output terminal, and a second output stage switch that is provided between the second power source output terminal and the voltage output terminal. The control method includes performing ON/OFF control of the first output stage switch and the second output stage switch such that both the first output stage switch and the second output stage switch are in an OFF state over a predetermined period encompassing a point in time when a signal level of the first signal switches.

The present disclosure enables a semiconductor device and a semiconductor device control method to be provided that are capable of suppressing the generation of abnormal display caused by shoot-through current.

BRIEF DESCRIPTION OF THE DRAWINGS

Exemplary embodiments will be described in detail based on the following figures, wherein:

FIG. 6 is a timing chart illustrating operation of a semiconductor device according to an exemplary embodiment of the present disclosure;

FIG. 7 is a timing chart illustrating operation during frame inversion and during frame switching in a semiconductor device according to an exemplary embodiment of the present disclosure; and FIG. 8 is a diagram illustrating effects from shoot-through current.

DETAILED DESCRIPTION

Figure 1:
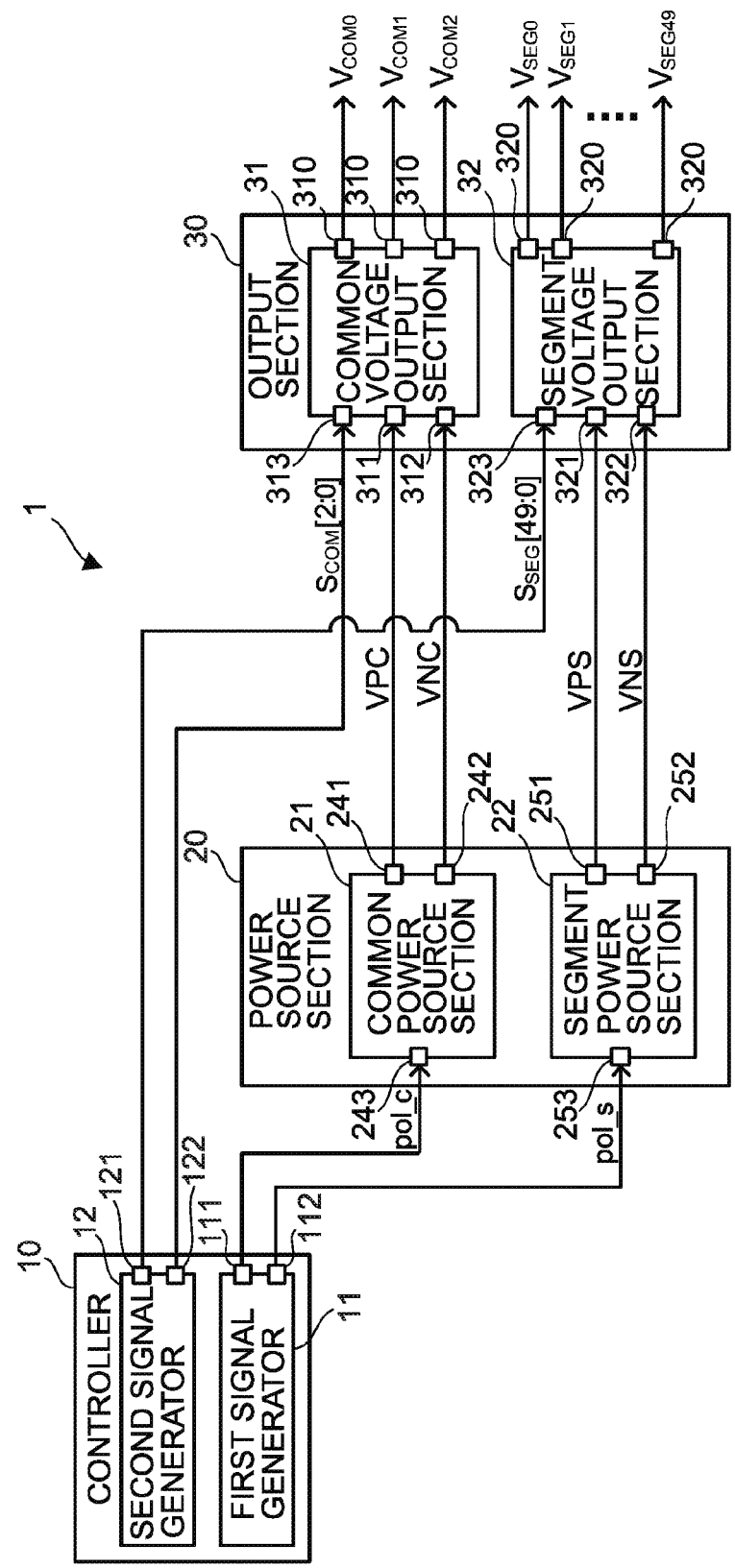
FIG. 1 is a diagram illustrating a configuration of a semiconductor device for configuring a liquid crystal drive circuit according to an exemplary embodiment of the present disclosure.

Explanation follows regarding an exemplary embodiment of the present disclosure, with reference to the drawings. In each of the drawings, the same or corresponding configuration elements and portions are allocated the same reference numerals.

Figure 2:
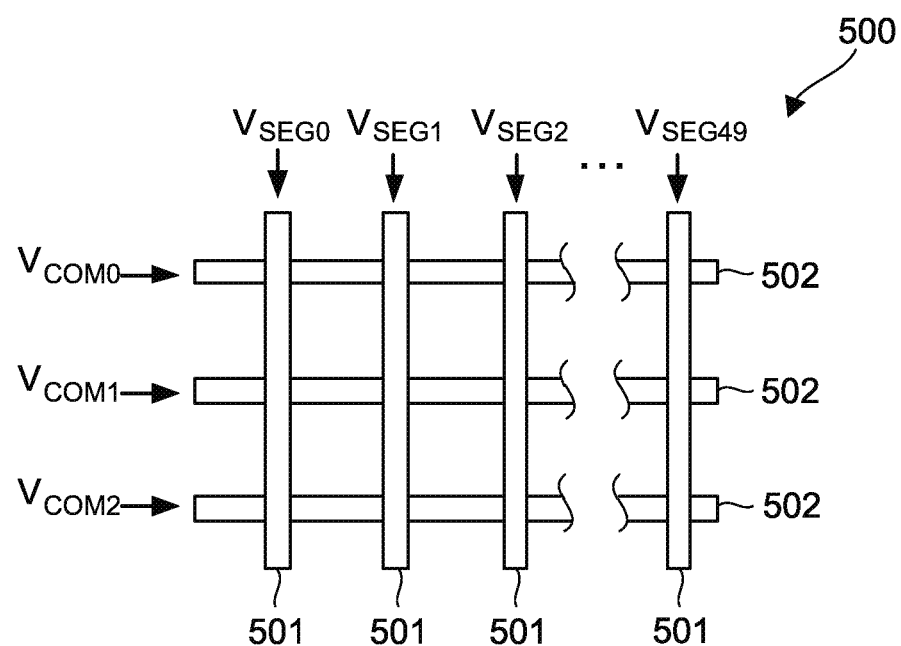
FIG. 2 is a diagram illustrating a configuration of a liquid crystal panel driven by a semiconductor device according to an exemplary embodiment of the present disclosure.

FIG. 1 is a block diagram illustrating a configuration of a semiconductor device 1 for configuring a liquid crystal drive circuit according to an exemplary embodiment of the present disclosure. FIG. 2 is a diagram illustrating an example of a configuration of a liquid crystal panel 500 driven by the semiconductor device 1.

The liquid crystal panel 500 includes plural segment electrodes 501 and plural common electrodes 502 that are arrayed in a lattice formation. Liquid crystal elements, not illustrated in the drawings, are provided at each intersection portion of the segment electrodes 501 and the common electrodes 502. FIG. 2 illustrates, as an example, the liquid crystal panel 500 including 50 segment electrodes 501, and 3 common electrodes 502. In the semiconductor device 1 according to the present exemplary embodiment, display of the liquid crystal panel 500 is controlled by supplying common voltages $V_{COM0}$, $V_{COM1}$ and $V_{COM2}$ respectively to the 3 common electrodes 502, and supplying segment voltages $V_{SEG0}$ to $V_{SEG49}$ respectively to the 50 segment electrodes 501. The semiconductor device 1, for example, displays an image on the liquid crystal panel 500 by employing a known sequential scanning method. The configuration of the liquid crystal panel driven by the semiconductor device 1 is not limited to that of the semiconductor device illustrating in FIG. 2, and the numbers of segment electrodes and common electrodes may differ from those of the liquid crystal panel 500 illustrated in FIG. 2.

As illustrated in FIG. 1, the semiconductor device 1 is configured including a controller 10, a power source section 20, and an output section 30.

The output section 30 includes a common voltage output section 31 and a segment voltage output section 32. The common voltage output section 31 includes plural common voltage output terminals 310 corresponding to each of the common electrodes 502 of the liquid crystal panel 500. The common voltages $V_{COM0}$, $V_{COM1}$ and $V_{COM2}$ are output from each of the common voltage output terminals 310. According to a common control signal $S_{COM}$ [2:0] supplied from the controller 10, the common voltage output section 31 sets the voltage levels of the common voltages $V_{COM0}$, $V_{COM1}$ and $V_{COM2}$ to either a high level voltage VPC or to a low level voltage VNC supplied from the power source section 20. The common voltage output section 31 includes an input terminal 313 that receives input of the common control signal $S_{COM}$ [2:0], an input terminal 311 that receives input of the high level voltage VPC, and an input terminal 312 that receives input of the low level voltage VNC.

The segment voltage output section 32 includes plural segment voltage output terminals 320 corresponding to each of the segment electrodes 501 of the liquid crystal panel 500. The segment voltages $V_{SEG0}$ to $V_{SEG49}$ are output from the respective segment voltage output terminals 320. Based on a segment control signal $S_{SEG}$ [49:0] supplied from the controller 10, the segment voltage output section 32 sets a voltage level of the segment voltages $V_{SEG0}$ to $V_{SEG49}$ to either a high level voltage VPS or a low level voltage VNS supplied from the power source section 20. The segment voltage output section 32 includes an input terminal 323 that receives input of the segment control signal $S_{SEG}$ [49:0], an input terminal 321 that receives input of the high level voltage VPS, and an input terminal 322 that receives input of the low level voltage VNS.

The power source section 20 includes a common power source section 21 and a segment power source section 22.

The common power source section 21 outputs the high level voltage VPC and the low level voltage VNC as power sources for generating the common voltages $V_{COM0}$, $V_{COM1}$ and $V_{COM2}$. The common power source section 21 changes the respective voltage level of the high level voltage VPC and the low level voltage VNC according to switching of the signal level of a common inversion signal pol_c supplied from the controller 10. In the present exemplary embodiment, the voltage level of the high level voltage VPC is changed in two steps, and the voltage level of the low level voltage VNC is changed in two steps. Namely, in the present exemplary embodiment, the common power source section 21 is compatible with ⅓ bias driving, and outputs 4 voltages of mutually different voltage levels (vpc1, vpc2, vnc1, and vnc2, described below). The common power source section 21 includes an output terminal 241 that outputs the high level voltage VPC, and an output terminal 242 that outputs the low level voltage VNC. The common power source section 21 includes an input terminal 243 that receives input of the common inversion signal pol_c.

The segment power source section 22 outputs the high level voltage VPS and the low level voltage VNS as power sources for generating the segment voltages $V_{SEG0}$ to $V_{SEG49}$. The segment power source section 22 changes the respective voltage level of the high level voltage VPS and the low level voltage VNS according to switching of the signal level of a segment inversion signal pol_s supplied from the controller 10. In the present exemplary embodiment, the voltage level of the high level voltage VPS is changed in two steps, and the voltage level of the low level voltage VNS is changed in two steps. Namely, in the present exemplary embodiment, the segment power source section 22 is compatible with ⅓ bias driving, and outputs 4 voltages of mutually different voltage levels (vps1, vps2, vns1, and vns2, described below). The segment power source section 22 includes an output terminal 251 that outputs the high level voltage VPS, and an output terminal 252 that outputs the low level voltage VNS. The segment power source section 22 includes an input terminal 253 that receives input of the segment inversion signal pol_s.

The controller 10 includes a first signal generator 11 and a second signal generator 12. The first signal generator 11 generates the common inversion signal pol_c and the segment inversion signal pol_s that change in signal level at timings when frame switching and frame inversion are performed. Frame switching is performed at every predetermined frame period synchronized to a clock signal, and frame inversion is performed when a period of half a single frame period has elapsed from after frame switching. Frame inversion is processing performed such that unevenness does not arise in the direction of the electrical field applied to the liquid crystal elements of the liquid crystal panel 500, and is performed by the magnitude relationship between the common voltage applied to the common electrodes 502 of the liquid crystal panel 500 and the segment voltage applied to the segment electrodes 501 being inverted between front half period and a rear half period of a single frame period. The controller 10 synchronizes with a clock signal generated by itself, and outputs the common inversion signal pol_c from an output terminal 111, and outputs the segment inversion signal pol_s from an output terminal 112.

The second signal generator 12 generates the segment control signal $S_{SEG}$ [49:0] and outputs the segment control signal $S_{SEG}$ [49:0] from an output terminal 121, and also generates the common control signal $S_{COM}$ [2:0] and outputs the common control signal $S_{COM}$ [2:0] from an output terminal 122.

The common control signal $S_{COM}$ [2:0] is a signal that independently controls the respective voltage levels of the common voltages $V_{COM0}$ to $V_{COM2}$ so as to sequentially select the common electrodes 502 of the liquid crystal panel 500. The common voltage output section 31 sets the voltage levels of the respective common voltages $V_{COM0}$ to $V_{COM2}$ individually to high level voltage VPC or low level voltage VNC according to the common control signal $S_{COM}$ [2:0].

The segment control signal $S_{SEG}$ [49:0] is a signal that controls the switching ON and OFF of each of the pixels in the liquid crystal panel 500 by independently controlling the respective voltage levels of the segment voltages $V_{SEG0}$ to $V_{SEG49}$ based on an image to be displayed. The segment voltage output section 32 sets the segment voltage levels $V_{SEG0}$ to $V_{SEG49}$ individually to high level voltage VPS or to low level voltage VNS according to the segment control signal $S_{SEG}$ [49:0].

Figure 3A:
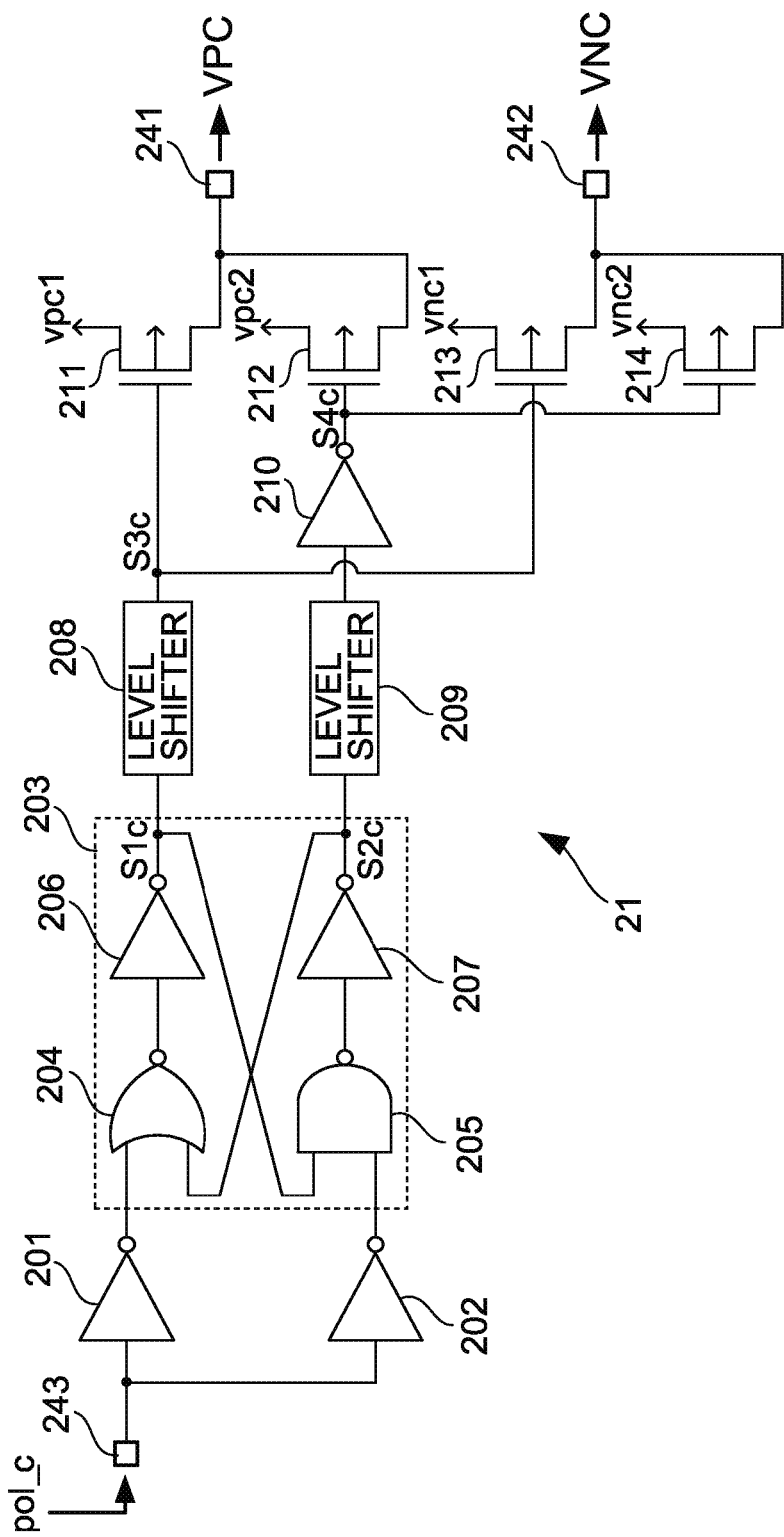
FIG. 3A is a diagram illustrating a configuration of a common power source section according to an exemplary embodiment of the present disclosure.
Figure 3B:
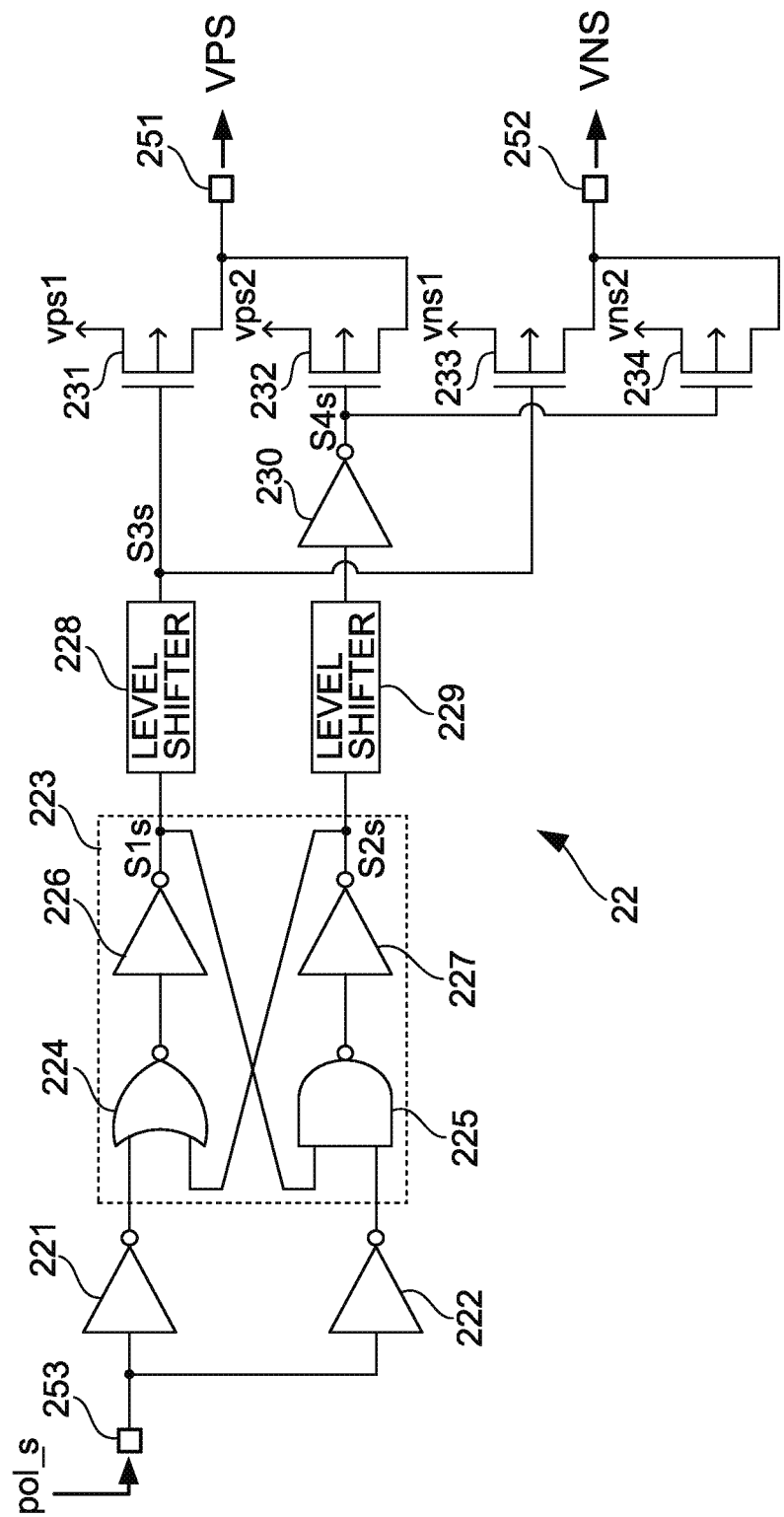
FIG. 3B is a diagram illustrating a configuration of a segment power source section according to an exemplary embodiment of the present disclosure.

FIG. 3A is a diagram illustrating a detailed configuration of the common power source section 21. FIG. 3B is a diagram illustrating a detailed configuration of the segment power source section 22. The common power source section 21 includes inverters 201 and 202 that have input terminals connected to the input terminal 243 receiving input of the common inversion signal pol_c.

The output terminals of the inverters 201 and 202 are connected to a timing regulation circuit 203. The timing regulation circuit 203 is configured including a NOR gate 204, a NAND gate 205, and inverters 206 and 207. The output terminal of the inverter 201 is connected to one input terminal of the NOR gate 204, and the output terminal of the inverter 207 is connected to the other input terminal of the NOR gate 204. The output terminal of the NOR gate 204 is connected to the input terminal of the inverter 206. The output terminal of the inverter 202 is connected to one input terminal of the NAND gate 205, and the output terminal of the inverter 206 is connected to the other input terminal of the NAND gate 205. The output terminal of the NAND gate 205 is connected to the input terminal of the inverter 207.

In a case in which the signal level of the common inversion signal pol_c transitions from low level to high level, the timing regulation circuit 203 transitions an output signal S1c of the inverter 206 from high level to low level only after an output signal S2c of the inverter 207 has transitioned from high level to low level. In a case in which the signal level of the common inversion signal pol_c transitions from high level to low level, the timing regulation circuit 203 transitions the output signal S2c of the inverter 207 from low level to high level only after the output signal S1c of the inverter 206 has transitioned from low level to high level. The timing regulation circuit 203 is not limited to the above circuit configuration, as long as it is configured so as to output the output signals Sic and S2c output from its two output terminals in the above sequence according to the signal level of the common inversion signal pol_c.

The output terminals of the inverters 206 and 207 that serve as the output terminals of the timing regulation circuit 203 are respectively connected to the input terminals of level shifters 208 and 209. The level shifters 208 and 209 include functionality to raise the level of signals output from the inverters 206 and 207.

The signal boosted by the level shifter 208 is supplied to gates of P-MOS transistors 211 and 213. The signal boosted by the level shifter 209 is supplied to gates of P-MOS transistors 212 and 214 after the signal level has been inverted.

The source of the P-MOS transistor 211 is connected to a power source line producing a voltage vpc1, and the drain of the P-MOS transistor 211 is connected to an output terminal 241 of the common power source section 21. The source of the P-MOS transistor 212 is connected to a power source line producing a voltage vpc2, and the drain of the P-MOS transistor 212 is connected to an output terminal 241 of the common power source section 21.

The source of the P-MOS transistor 213 is connected to a power source line producing a voltage vnc1, and the drain of the P-MOS transistor 213 is connected to an output terminal 242 of the common power source section 21. The source of the P-MOS transistor 214 is connected to a power source line producing a voltage vnc2, and the drain of the P-MOS transistor 214 is connected to an output terminal 242 of the common power source section 21. The magnitude relationship between the voltage generated by each of the power source lines is vpc1>vpc2>vnc1>vnc2.

In the common power source section 21, the P-MOS transistors 211 and 212 are switched ON or OFF in a complementary manner. In a case in which the P-MOS transistor 211 adopts an ON state, the voltage vpc1 is output as the high level voltage VPC from the output terminal 241, and in a case in which the P-MOS transistor 212 adopts an ON state, the voltage vpc2 is output as the high level voltage VPC from the output terminal 241.

In the common power source section 21, the P-MOS transistors 213 and 214 are switched ON or OFF in a complementary manner. In a case in which the P-MOS transistor 213 adopts an ON state, the voltage vnc1 is output as the low level voltage VNC from the output terminal 242, and when the P-MOS transistor 214 adopts an ON state, the voltage vnc2 is output as the low level voltage VNC from the output terminal 242.

According to the signal level of the common inversion signal pol_c, the common power source section 21 selects the voltage for output as the high level voltage VPC from out of the voltage vpc1 and vpc2, selects the voltage for output as the low level voltage VNC from out of the voltage vnc1 and vnc2. In the present exemplary embodiment, in a case in which the voltage selected as the high level voltage VPC is vpc1, the voltage selected as the low level voltage VNC is vnc1. If the voltage selected as the high level voltage VPC is vpc2, the voltage selected as the low level voltage VNC is vnc2.

In the present exemplary embodiment, the common inversion signal pol_c is expressed at high level in the front half period of a single frame period, the P-MOS transistors 211 and 213 thereby adopt an ON state, and the P-MOS transistors 212 and 214 thereby adopt an OFF state. Thus in the front half period of a single frame period, the voltage vpc1 is output as the high level voltage VPC, and the voltage vnc1 is output as the low level voltage VNC. In the present exemplary embodiment, the common inversion signal pol_c is expressed at low level in the rear half period of a single frame, and the P-MOS transistors 212 and 214 thereby adopt an ON state, and the P-MOS transistors 211 and 213 thereby adopt an OFF state. Thus in the rear half period of a single frame, the voltage vpc2 is output as the high level voltage VPC, and the voltage vnc2 is output as the low level voltage VNC. The common power source section 21 accordingly changes the voltage levels of the high level voltage VPC and the low level voltage VNC according to the common inversion signal pol_c output from the controller 10.

Due to the timing regulation function of the timing regulation circuit 203, in a case in which the P-MOS transistors 212 and 214 are transitioned from an OFF state to an ON state, the P-MOS transistors 212 and 214 transition from an OFF state to an ON state only after the P-MOS transistors 211 and 213 have transitioned from an ON state to an OFF state. Moreover, in a case in which the P-MOS transistors 211 and 213 are transitioned from an OFF state to an ON state, the P-MOS transistors 211 and 213 transition from an OFF state to an ON state only after the P-MOS transistors 212 and 214 have transitioned from an ON state to an OFF state.

Thus by switching the transistors in the OFF state to the ON state only after the transistors in an ON state have switched to an OFF state, shoot-through current due to the P-MOS transistors 211 and 212 being in an ON state at the same time is suppressed from occurring, and shoot-through current due to the P-MOS transistors 213 and 214 being in an ON state at the same time is suppressed from occurring.

Although the common power source section 21 includes in this manner the timing regulation circuit 203 that suppresses the generation of shoot-through current occurring between power sources, complete prevention of shoot-through current generation using the timing regulation function of the timing regulation circuit 203 is gradually becoming difficult due to recent demands for lower voltages of semiconductor devices. Namely, in cases in which the power source voltage supplied to the semiconductor device 1 is a low voltage (for example, 1V or lower), lag times caused by the slew rate, the wiring line length, and the capacity load etc. of the circuit formed by the semiconductor device 1 become significant, and either the timing regulation circuit 203 ceases to function appropriately, or the circuit does not operate at the intended timing due to the influence of the lag time generated in the level shifters 208, 209 at a stage after the timing regulation circuit 203. The shoot-through current referred to above may accordingly be generated.

The segment power source section 22 has a configuration similar to that of the common power source section 21. The segment power source section 22 includes inverters 221 and 222 whose input terminals are connected to the input terminal 253 that receives input of the segment inversion signal pol_s.

The output terminals of the inverters 221 and 222 are connected to a timing regulation circuit 223. The timing regulation circuit 223 is configured including a NOR gate 224, a NAND gate 225, and inverters 226 and 227. The output terminal of the inverter 221 is connected to one input terminal of the NOR gate 224, and the output terminal of the inverter 227 is connected to the other input terminal of the NOR gate 224. The output terminal of the NOR gate 224 is connected to the input terminal of the inverter 226. The output terminal of the inverter 222 is connected to one input terminal of the NAND gate 225, and the output terminal of the inverter 226 is connected to the other input terminal of the NAND gate 225. The output terminal of the NAND gate 225 is connected to the input terminal of the inverter 227.

In a case in which the signal level of the segment inversion signal pol_s transitions from low level to high level, the timing regulation circuit 223 transitions an output signal S1s of the inverter 226 from high level to low level only after an output signal S2s of the inverter 227 has transitioned from high level to low level. In a case in which the signal level of the segment inversion signal pol_s has transitioned from high level to low level, the timing regulation circuit 223 transitions the output signal S2s of the inverter 227 from low level to high level only after the output signal S1s of the inverter 226 has transitioned from low level to high level.

The output terminals of the inverters 226 and 227 that serve as the output terminals of the timing regulation circuit 223 are respectively connected to the input terminals of level shifters 228 and 229. The level shifters 228 and 229 include functionality to raise the level of signals output from the inverters 226 and 227.

The signal boosted by the level shifter 228 is supplied to gates of P-MOS transistors 231 and 233. The signal boosted by the level shifter 229 is supplied to gates of P-MOS transistors 232 and 234 after being inverted in signal level by an inverter 230.

The source of the P-MOS transistor 231 is connected to a power source line producing a voltage vps1, and the drain of the P-MOS transistor 231 is connected to an output terminal 251 of the segment power source section 22. The source of the P-MOS transistor 232 is connected to a power source line producing a voltage vps2, and the drain of the P-MOS transistor 232 is connected to the output terminal 251 of the segment power source section 22.

The source of the P-MOS transistor 233 is connected to a power source line producing a voltage vns1, and the drain of the P-MOS transistor 233 is connected to an output terminal 252 of the segment power source section 22. The source of the P-MOS transistor 234 is connected to a power source line producing a voltage vns2, and the drain of the P-MOS transistor 234 is connected to the output terminal 252 of the segment power source section 22. The magnitude relationship between the voltage generated by each of the power source lines is vps1>vps2>vns1>vns2. Note that relationships to the output voltages of the common power source section 21 may be, for example, vps1=vpc1, vps2=vpc2, vns1=vnc1, vns2=vnc2.

In the segment power source section 22, the P-MOS transistors 231 and 232 are switched ON or OFF in a complementary manner. In a case in which the P-MOS transistor 231 adopts an ON state, the voltage vps1 is output as the high level voltage VPS from the output terminal 251, and in a case in which the P-MOS transistor 232 adopts an ON state, the voltage vps2 is output as the high level voltage VPS from the output terminal 251.

In the segment power source section 22, the P-MOS transistors 233 and 234 are switched ON or OFF in a complementary manner. In a case in which the P-MOS transistor 233 adopts an ON state, the voltage vns1 is output as the low level voltage VNS from the output terminal 252, and in a case in which the P-MOS transistor 234 adopts an ON state, the voltage vns2 is output as the low level voltage VNS from the output terminal 252.

According to the signal level of the segment inversion signal pol_s, the segment power source section 22 selects the voltage for output as the high level voltage VPS from out of the voltage vps1 and vps2, and selects the voltage for output as the low level voltage VNS from out of the voltage vns1 and vns2. In the present exemplary embodiment, if the voltage selected as the high level voltage VPS is vps1, the voltage selected as the low level voltage VNS is vns1. If the voltage selected as the high level voltage VPS is vps2, the voltage selected as the low level voltage VNS is vns2.

In the present exemplary embodiment, the segment inversion signal pol_s is expressed at low level in the front half period of a single frame period, the P-MOS transistors 232 and 234 thereby adopt an ON state, and the P-MOS transistors 231 and 233 thereby adopt an OFF state. Thus in the front half period of a single frame period, the voltage vps2 is output as the high level voltage VPS, and the voltage vns2 is output as the low level voltage VNS. In the present exemplary embodiment, the segment inversion signal pol_s is expressed at high level in the rear half period of a single frame, and the P-MOS transistors 231 and 233 thereby adopt an ON state, and the P-MOS transistors 232 and 234 thereby adopt an OFF state. Thus in the rear half period of a single frame, the voltage vps1 is output as the high level voltage VPS, and the voltage vns1 is output as the low level voltage VNS. The segment power source section 22 accordingly changes the voltage levels of the high level voltage VPS and the low level voltage VNS according to the segment inversion signal pol_s output from the controller 10.

Due to the timing regulation function of the timing regulation circuit 223, in a case in which the P-MOS transistors 232 and 234 are transitioned from an OFF state to an ON state, the P-MOS transistors 232 and 234 transition from an OFF state to an ON state only after the P-MOS transistors 231 and 233 have transitioned from an ON state to an OFF state. In a case in which the P-MOS transistors 231 and 233 are transitioned from an OFF state to an ON state, the P-MOS transistors 231 and 233 transition from an OFF state to an ON state only after the P-MOS transistors 232 and 234 have transitioned from an ON state to an OFF state.

Thus by switching the transistors in the OFF state to the ON state only after the transistors in an ON state have switched to an OFF state, shoot-through current due to the P-MOS transistors 231 and 232 being in an ON state at the same time is suppressed from occurring, and shoot-through current due to the P-MOS transistors 233 and 234 being in an ON state at the same time is suppressed from occurring.

Although the segment power source section 22, similarly to the common power source section 21, includes in this manner the timing regulation circuit 223 that suppresses the generation of shoot-through current occurring between power sources, complete prevention of the shoot-through current generation referred to above using the timing regulation function of the timing regulation circuit 223 is gradually becoming difficult due to recent demands for lower voltages of semiconductor devices. Namely, in cases in which the power source voltage supplied to the semiconductor device 1 is a low voltage (for example, 1V or lower), lag times caused by the slew rate, the wiring line length, and the capacity load etc. of the circuit formed by the semiconductor device 1 become significant, and either the timing regulation circuit 223 ceases to function appropriately, or the circuit does not operate at the intended timing due to the influence of the lag time generated in the level shifters 228, 229 at a stage after the timing regulation circuit 223. There is accordingly a possibility of the shoot-through current referred to being generated.

Figure 4:
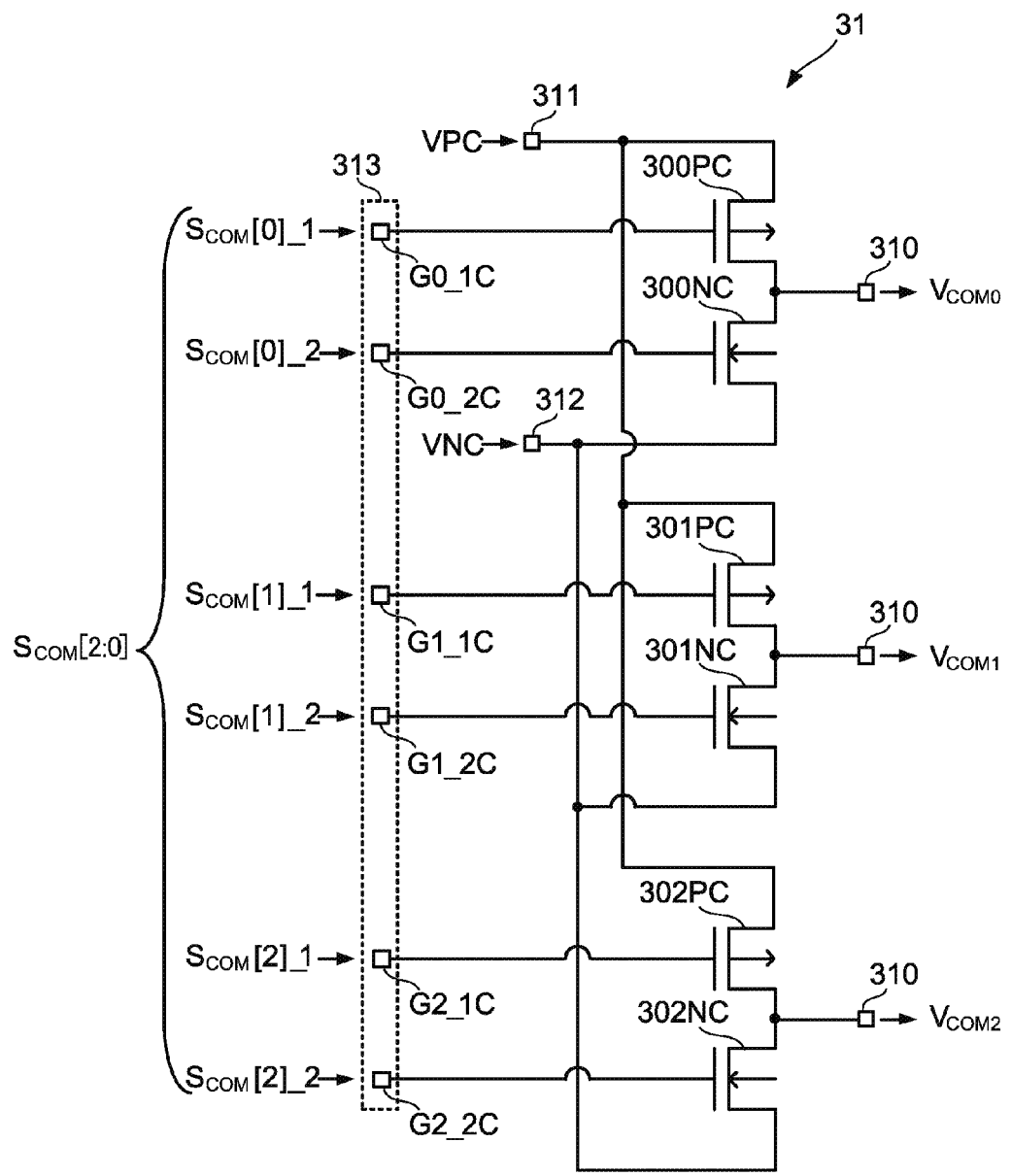
FIG. 4 is a diagram illustrating a configuration of a common voltage output section according to an exemplary embodiment of the present disclosure.

FIG. 4 is a diagram illustrating a detailed configuration of the common voltage output section 31. The common voltage output section 31 includes a P-MOS transistor 300PC and an N-MOS transistor 300NC that are connected to the common voltage output terminal 310 that outputs the common voltage $V_{COM0}$, a P-MOS transistor 301PC and an N-MOS transistor 301NC that are connected to the common voltage output terminal 310 that outputs the common voltage $V_{COM1}$, and a P-MOS transistor 302PC and an N-MOS transistor 302NC that are connected to the common voltage output terminal 310 that outputs the common voltage $V_{COM2}$.

The respective sources of the P-MOS transistors 300PC, 301PC, 302PC are each connected to the input terminal 311 that is input with the high level voltage VPC output from the common power source section 21, and the respective drains of the P-MOS transistors 300PC, 301PC, 302PC are each connected to the corresponding common voltage output terminal 310. The respective sources of the N-MOS transistors 300NC, 301NC, 302NC are each connected to the input terminal 312 that is input with the low level voltage VNC output from the common power source section 21, and the respective drains of the N-MOS transistors 300NC, 301NC, 302NC are each connected to the corresponding common voltage output terminal 310.

The input terminal 313 that receives input of the common control signal $S_{COM}$ [2:0] is configured with the gates G0_1C, G0_2C, G1_1C, G1_2C, G2_1C, and G2_2C of each of the transistors. The common control signal $S_{COM}$ [2:0] includes the common control signals $S_{COM}$ [0]_1, $S_{COM}$ [0]_2, $S_{COM}$ [1]_1, $S_{COM}$ [1]_2, $S_{COM}$ [2]_1 and $S_{COM}$ [2]_2 that are supplied to each of the gates.

The common control signals $S_{COM}$ [0]_1, $S_{COM}$ [0]_2 are signals for controlling the voltage level of the common voltage $V_{COM0}$ by independently controlling switching ON or OFF of the P-MOS transistor 300PC and the N-MOS transistor 300NC. By, for example, the P-MOS transistor 300PC adopting an ON state, and the N-MOS transistor 300NC adopting an OFF state according to the control signals $S_{COM}$ [0]_1, $S_{COM}$ [0]_2, the voltage level of the common voltage $V_{COM0}$ becomes that of the high level voltage VPC. Moreover, by the N-MOS transistor 300NC adopting an ON state and the P-MOS transistor 300PC adopting an OFF state according to the control signals $S_{COM}$ [0]_1, $S_{COM}$ [0]_2, the voltage level of the common voltage $V_{COM0}$ becomes that of the low level voltage VNC.

Similarly, the common control signals $S_{COM}$ [1]_1, $S_{COM}$ [1]_2 are signals for controlling the voltage level of the common voltage $V_{COM1}$ by independently controlling switching ON or OFF of the P-MOS transistor 301PC and the N-MOS transistor 301NC. The common control signals $S_{COM}$ [2]_1, $S_{COM}$ [2]_2 are signals for controlling the voltage level of the common voltage $V_{COM2}$ by independently controlling switching ON or OFF of the P-MOS transistor 302PC and the N-MOS transistor 302NC.

Although in the present exemplary embodiment P-MOS transistors and N-MOS transistors are employed as switches for selecting the voltage levels of the common voltages $V_{COM0}$, $V_{COM1}$ and $V_{COM2}$, the switches may be configured by P-MOS transistors alone, or by N-MOS transistors alone. Moreover, bipolar transistors may be employed.

Figure 5:
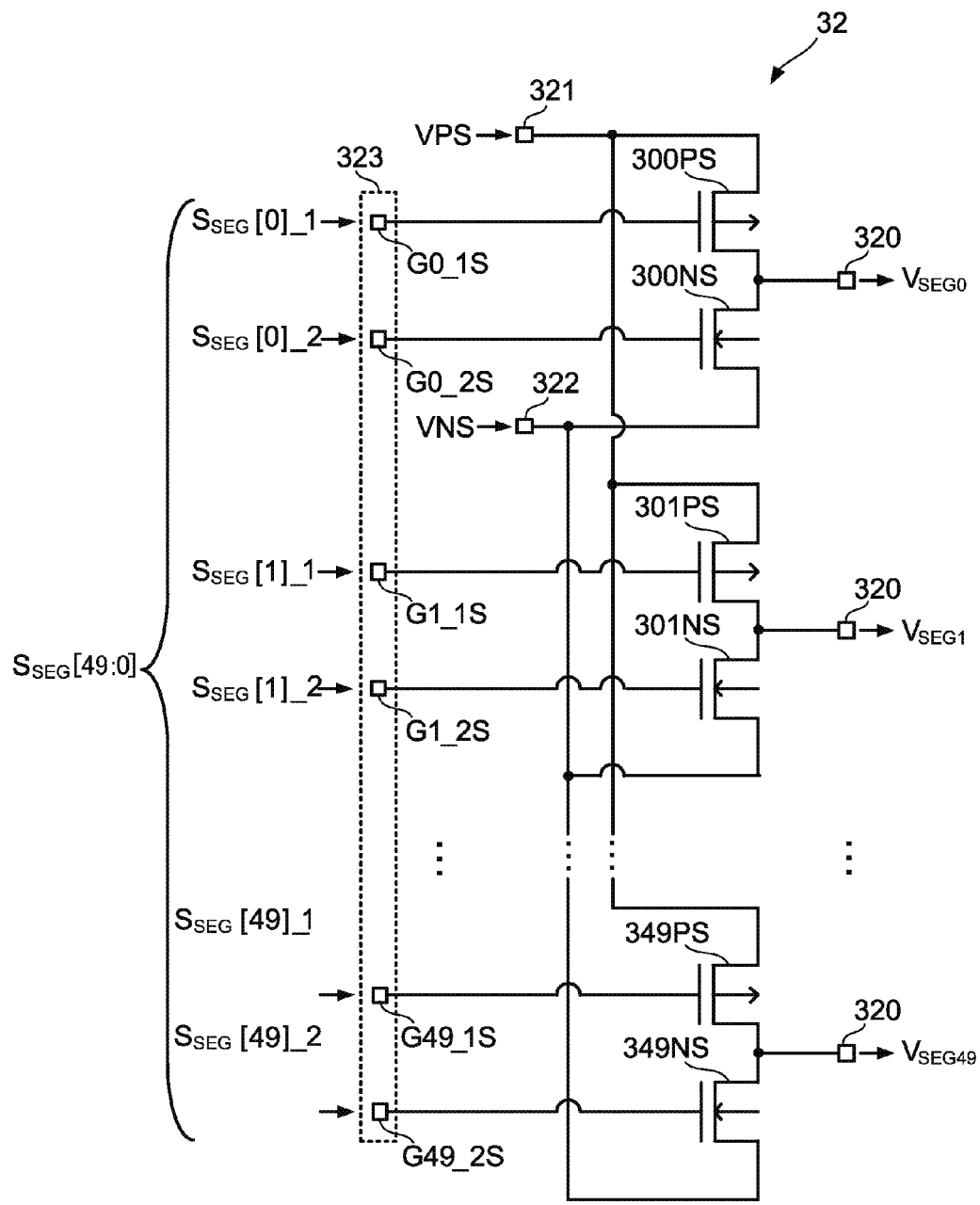
FIG. 5 is a diagram illustrating a configuration of a segment voltage output section according to an exemplary embodiment of the present disclosure.

FIG. 5 is diagram illustrating a detailed configuration of the segment voltage output section 32. The segment voltage output section 32 has a similar configuration to that of the common voltage output section 31. The segment voltage output section 32 includes a P-MOS transistor 300PS and an N-MOS transistor 300NS that are connected to the segment voltage output terminal 320 that outputs the segment voltage $V_{SEG0}$, a P-MOS transistor 301PS and an N-MOS transistor 301NS that are connected to the segment voltage output terminal 320 that outputs the segment voltage $V_{SEG1}$, and so on up to a P-MOS transistor 349PS and an N-MOS transistor 349NS that are connected to the segment voltage output terminal 320 that outputs the segment voltage $V_{SEG49}$. Note that, although omitted from illustration in FIG. 5, the segment voltage output section 32 includes 50 of the segment voltage output terminals 320, respectively corresponding to the 50 segment electrodes 501 provided in the liquid crystal panel 500, and P-MOS transistors and N-MOS transistors that are respectively connected to each of these 50 segment voltage output terminals 320.

The respective sources of the P-MOS transistors 300PS, 301PS, ... 349PS are each connected to the input terminal 321 that is input with the high level voltage VPS output from the segment power source section 22, and the respective drains of the P-MOS transistors 300PS, 301PS, ... 349PS are each connected to the corresponding segment voltage output terminal 320. The respective sources of the N-MOS transistors 300NS, 301NS, ... 349NS are each connected to the input terminal 322 that is input with the low level voltage VNS output from the segment power source section 22, and the respective drains of the N-MOS transistors 300NS, 301NS, ... 349NS are each connected to the corresponding segment voltage output terminal 320.

The input terminal 323 that receives input of the segment control signal $S_{SEG}$ [49:0] is configured with the gates G0_1S, G0_2S, G1_1S, G1_2S, ..., G49_15, and G49_2S of each of the transistors. The segment control signal $S_{SEG}$ [49:0] includes the segment control signals $S_{SEG}$ [0]_1, $S_{SEG}$ [0]_2, $S_{SEG}$ [1]_1, $S_{SEG}$ [1]_2, ..., $S_{SEG}$ [49]_1, and $S_{SEG}$ [49]_2 that are supplied to each of the gates.

The segment control signals $S_{SEG}$ [0]_1, $S_{SEG}$ [0]_2 are signals for controlling the voltage level of the segment voltage $V_{SEG0}$ by independently controlling switching ON or OFF of the P-MOS transistor 300PS and the N-MOS transistor 300NS. By, for example, the P-MOS transistor 300PS adopting an ON state, and the N-MOS transistor 300NS adopting an OFF state according to the control signals $S_{SEG}$ [0]_1, $S_{SEG}$ [0]_2, the voltage level of the segment voltage $V_{SEG0}$ becomes the high level voltage VPS. Moreover, by the N-MOS transistor 300NS adopting an ON state and the P-MOS transistor 300PS adopting an OFF state according to the control signals $S_{SEG}$ [0]_1, $S_{SEG}$ [0]_2, the voltage level of the segment voltage $V_{SEG0}$ becomes of the low level voltage VNS.

Similarly, the control signals $S_{SEG}$ [1]_1, $S_{SEG}$ [1]_2 are signals for controlling the voltage level of the segment voltage $V_{SEG1}$ by independently controlling switching ON or OFF of the P-MOS transistor 301PS and the N-MOS transistor 301NS. The segment control signals $S_{SEG}$ [49]_1, $S_{SEG}$ [49]_2 are signals for controlling the voltage level of the segment voltage $V_{SEG49}$ by independently controlling switching ON or OFF of the P-MOS transistor 349PS and the N-MOS transistor 349NS.

Although in the present exemplary embodiment P-MOS transistors and N-MOS transistors are employed as switches for selecting the voltage levels of the segment voltages $V_{SEG0}$, $V_{SEG1}$ ... $V_{SEG49}$, the switches may be configured by P-MOS transistors alone, or by N-MOS transistors alone. Moreover, bipolar transistors may be employed.

Explanation follows regarding operation of the semiconductor device 1 according to the present exemplary embodiment. FIG. 6 is a timing chart illustrating an example of operation of the semiconductor device 1. The semiconductor device 1 operates in synchronization with a clock signal clk generated within the controller 10. The semiconductor device 1 also performs frame inversion in which the magnitude relationship between the common voltage applied to the common electrodes 502 and the segment voltage applied to the segment electrodes 501 of the liquid crystal panel 500 is inverted between the front half period and the rear half period of a single frame period $T_F$.

The controller 10 employs the clock signal clk to count single frame periods $T_F$, and generates a frame inversion signal pol that changes signal level every period equivalent to half the single frame period $T_F$. The controller 10 generates the common inversion signal pol_c and the segment inversion signal pol_s that change signal level according to changes in the signal level of the frame inversion signal pol, and respectively supply the common inversion signal pol_c and the segment inversion signal pol_s to the common power source section 21 and the segment power source section 22.

In the front half period of the single frame period $T_F$, the common inversion signal pol_c is expressed at high level.

The P-MOS transistors 211 and 213 of the common power source section 21 thereby adopt an ON state, and the P-MOS transistors 212 and 214 adopt an OFF state. The common power source section 21 accordingly outputs the voltage vpc1 as the high level voltage VPC and outputs the voltage vnc1 as the low level voltage VNC during the front half period of the single frame period $T_F$. The common voltage output section 31 sets the voltage level of the common voltages $V_{COM0}$, $V_{COM1}$ and $V_{COM2}$ to either high level voltage VPC (vpc1) or to low level voltage VNC (vnc1) according to the common control signal $S_{COM}$ [2:0] supplied from the controller 10, and outputs the voltages.

In the present exemplary embodiment, the front half period of the single frame period $T_F$ is divided into three divisions. In the first third divided period, the voltage level of the common voltage $V_{COM0}$ is set to high level voltage (vpc1), in the next third divided period the voltage level of the common voltage $V_{COM1}$ is set to high level voltage (vpc1), and in the final third divided period, the voltage level of the common voltage $V_{COM2}$ is set to high level voltage (vpc1). In the front half period of the single frame period $T_F$, the pixels that are connected to the common electrodes 502 applied with the high level voltage (vpc1) are ON and are selected as the target of switching.

In the front half period of the single frame period $T_F$, the segment inversion signal pol_s is expressed as low level. The P-MOS transistors 232 and 234 of the segment power source section 22 thereby adopt an ON state, and the P-MOS transistors 231 and 233 adopt an OFF state. Thus in the front half period of the single frame period $T_F$ the segment power source section 22 outputs the voltage vps2 as the high level voltage VPS, and outputs the voltage vns2 as the low level voltage VNS. The segment voltage output section 32 sets the voltage level of the segment voltages $V_{SEG0}$, $V_{SEG1}$, $V_{SEG49}$ to either high level voltage VPS (vps2) or low level voltage VNS (vns2) according to the segment control signals $S_{SEG}$ [49:0] supplied from the controller 10, and outputs the voltages.

In the front half period of the single frame period $T_F$, pixels disposed at the intersection portions between the segment electrodes 501 applied with the low level voltage VNS (vns2) and the common electrodes 502 applied with the high level voltage (vpc1) are switched ON, and pixels disposed at the intersection portions between the segment electrodes 501 applied with the high level voltage VPS (vps2) and the common electrodes 502 applied with the low level voltage VNC (vnc1) are switched OFF. Namely, the pixels disposed at locations where the potential difference between the segment electrodes 501 and the common electrodes 502 is the greatest are switched ON, and pixels other than these are switched OFF.

However, in the rear half period of the single frame period $T_F$, the common inversion signal pol_c is expressed as low level. The P-MOS transistors 212 and 214 of the common power source section 21 thereby adopt an ON state, and the P-MOS transistors 211 and 213 adopt an OFF state. Thus in the rear half period of the single frame period $T_F$ the common power source section 21 outputs the voltage vpc2 as the high level voltage VPC, and outputs the voltage vnc2 as the low level voltage VNC. The common voltage output section 31 sets the voltage level of the common voltages $V_{COM0}$, $V_{COM1}$ and $V_{COM2}$ to either high level voltage VPC (vpc2) or low level voltage VNC (vnc2) according to the common control signal $S_{COM}$ [2:0] supplied from the controller 10, and outputs the voltages.

In the present exemplary embodiment, the rear half period of the single frame period $T_F$ is divided into three divisions. In the final third divided period the voltage level of the common voltage $V_{COM0}$ is set to low level voltage (vnc2), in the next third divided period the voltage level of the common voltage $V_{COM1}$ is set to low level voltage (vnc2), and in the final third divided period the voltage level of the common voltage $V_{COM2}$ is set to low level voltage (vnc2). In the rear half period of the single frame period $T_F$, the pixels that are connected to the common electrodes 502 applied with the low level voltage (vpc2) are ON and are selected as the target of switching.

In the rear half period of the single frame period $T_F$, the segment inversion signal pol_s is expressed as high level. The P-MOS transistors 231 and 233 of the segment power source section 22 thereby adopt an ON state, and the P-MOS transistors 232 and 234 adopt an OFF state. Thus in the rear half period of the single frame period $T_F$ the segment power source section 22 outputs the voltage vps1 as the high level voltage VPS, and outputs the voltage vns1 as the low level voltage VNS. The segment voltage output section 32 sets the voltage level of the segment voltages $V_{SEG0}$, $V_{SEG1}$, $V_{SEG49}$ to either high level voltage VPS (vps1) or low level voltage VNS (vns1) according to the segment control signals $S_{SEG}$ [49:0] supplied from the controller 10, and outputs the voltages.

In the rear half period of the single frame period $T_F$, pixels disposed at the intersection portions between the segment electrodes 501 applied with the high level voltage VPS (vps1) and the common electrodes 502 applied with the low level voltage (vnc2) are switched ON, and pixels disposed at the intersection portions between the segment electrodes 501 applied with the low level voltage VNS (vns1) and the common electrodes 502 applied with the high level voltage VPC (vpc2) are switched OFF. Namely, the pixels disposed at locations where the potential difference between the segment electrodes 501 and the common electrodes 502 is the greatest are switched ON, and pixels other than these are switched OFF. Thus as the voltage levels for the high level voltage VPC, VPS and the low level voltage VNC, VNS respectively change, the magnitude relationship between the voltage applied to the common electrodes and the voltage applied to the segment electrodes is inverted between the front half period and the rear half period of a single frame period $T_F$.

Detailed explanation follows regarding operation during frame inversion and during frame switching.

When the front half period of the single frame period $T_F$ ends, the signal level of the common inversion signal pol_c transitions from high level to low level, and the signal level of the segment inversion signal pol_s transitions from low level to high level.

The signal level of the output signal S1c of the timing regulation circuit 203 of the common power source section 21 transitions from low level to high level due to the signal level of the common inversion signal pol_c transitioning from high level to low level. Then, due to the timing regulation function of the timing regulation circuit 203, the signal level of the output signal S2c is transitioned from low level to high level only after the signal level of the output signal S1c has been transitioned from low level to high level.

The output signal S1c of the timing regulation circuit 203 is input to the level shifter 208. The level shifter 208 boosts the signal level of the output signal S1c of the timing regulation circuit 203, and outputs the boosted signal as an output signal S3c. The timing of transition of the signal level of the output signal S3c of the level shifter 208 from low level to high level is delayed with respect to the timing at which the signal level of the output signal S1c of the timing regulation circuit 203 transitions from low level to high level.

The output signal S2c of the timing regulation circuit 203 is input to the level shifter 209, and is input to an inverter 210 after the signal level has been boosted. The inverter 210 outputs the inverted output signal of the level shifter 209 as an output signal S4c. The timing of transition of the signal level of the output signal S4c of the inverter 210 from high level to low level is delayed with respect to the timing at which the signal level of the output signal S2c of the timing regulation circuit 203 transitions from low level to high level.

In the example illustrated in FIG. 6, accompanying the transition of the common inversion signal pol_c from high level to low level, the timing at which the signal level of the output signal S3c of the level shifter 208 transitions from low level to high level is made in advance of the timing of the transition of the signal level of the output signal S4c of the inverter 210 from high level to low level, and timing regulated by the timing regulation circuit 203 is maintained. Thus, the common power source section 21, the P-MOS transistors 212 and 214 transition from an OFF state to an ON state only after the P-MOS transistors 211 and 213 have transitioned from an ON state to an OFF state. In the common power source section 21, due to switching each of the transistors ON or OFF in the sequence described above, generation of shoot-through current due to the P-MOS transistors 211 and 212 being in an ON state at the same time is prevented, and generation of shoot-through current due to the P-MOS transistors 213 and 214 being in an ON state at the same time is prevented.

Moreover, the signal level of the output signal S2s of the timing regulation circuit 223 of the segment power source section 22 transitions from high level to low level due to the signal level of the segment inversion signal pol_s transitioning from low level to high level. Then, due to the timing regulation function of the timing regulation circuit 223, the signal level of the output signal S1s transitions from high level to low level only after the signal level of the output signal S2s has transitioned from high level to low level.

The output signal S1s of the timing regulation circuit 223 is input to the level shifter 228. The level shifter 228 boosts the signal level of the output signal S1s of the timing regulation circuit 223, and outputs the boosted signal as an output signal S3s. The timing of transition of the signal level of the output signal S3s of the level shifter 228 from high level to low level is delayed with respect to the timing at which the signal level of the output signal S1s of the timing regulation circuit 223 transitions from high level to low level.

The output signal S2s of the timing regulation circuit 223 is input to the level shifter 229, and is input to an inverter 230 after the signal level has been boosted. The inverter 230 outputs the inverted output signal of the level shifter 229 as an output signal S4s. The timing of transition of the signal level of the output signal S4s of the level shifter 230 from low level to high level is delayed with respect to the timing at which the signal level of the output signal S2s of the timing regulation circuit 223 transitions from high level to low level.

In the example illustrated in FIG. 6, accompanying the transition of the segment inversion signal pol_s from low level to high level, the timing at which the signal level of the output signal S3s of the level shifter 228 transitions from high level to low level is made in advance of the timing of the transition of the signal level of the output signal S4s of the inverter 230 from low level to high level. Namely, the signal levels of the output signals S3s and S4s transition in the opposite sequence to the sequence set in the timing regulation circuit 223. Thus in the segment power source section 22, the P-MOS transistors 232 and 234 transition from an ON state to an OFF state only after the P-MOS transistors 231 and 233 have transitioned from an OFF state to an ON state. Switching each of the transistors ON or OFF in the segment power source section 22 in the sequence described above gives rise to a period in which the P-MOS transistors 231 and 232 are in an ON state at the same time, and shoot-through current is generated. Moreover, a period in which the P-MOS transistors 233 and 234 are in an ON state at the same time also arises, and shoot-through current is generated.

When the single frame period TF has ended, the signal level of the common inversion signal pol_c transitions from low level to high level, and the signal level of the segment inversion signal pol_s transitions from high level to low level.

In the example illustrated in FIG. 6, accompanying the transition of the common inversion signal pol_c from low level to high level, the timing at which the signal level of the output signal S3c of the level shifter 208 transitions from high level to low level is made in advance of the timing of the transition of the signal level of the output signal S4c of the inverter 210 from low level to high level. Namely, the output signals S3c and S4c transition the signal level in the opposite sequence to the sequence set in the timing regulation circuit 203. Thus in the common power source section 21, the P-MOS transistors 212 and 214 transition from an ON state to an OFF state only after the P-MOS transistors 211 and 213 have transitioned from an OFF state to an ON state. Switching each of the transistors ON or OFF in the common power source section 21 in the sequence described gives rise to a period in which the P-MOS transistors 211 and 212 are in an ON state at the same time, and shoot-through current is generated. Moreover, a period in which the P-MOS transistors 213 and 214 are in an ON state at the same time arises, and shoot-through current is generated A mismatch in the ON or OFF switching timings of each of the transistors that induce the occurrence of the shoot-through current referred to above is significant in cases in which the power source voltage supplied to the semiconductor device 1 is a low voltage (for example, 1V or lower). It is difficult to completely prevent the generation of such shoot-through current under the recent demands for lower voltages.

FIG. 8 is a diagram illustrating the effect of the shoot-through current referred to above. As illustrated in FIG. 8, when the shoot-through current referred to above is generated in the segment power source section 22 at the timing when the front half period of the single frame period TF ends and frame inversion is performed, the voltage levels of the segment voltages $V_{SEG0}$ to $V_{SEG49}$ are disrupted, with a possibility that abnormal display, such as flickering, being generated in the liquid crystal panel 500. When the shoot-through current referred to above is generated in the common power source section 21 at the timing when the single frame period TF ends and frame switching is performed, the voltage levels of the common voltages $V_{COM0}$ to $V_{COM2}$ are disrupted, with a possibility of abnormal display, such as flickering, being generated in the liquid crystal panel 500.

Thus in the semiconductor device 1 according to the present exemplary embodiment, at the timing of frame inversion or frame switching when there is a possibility of shoot-through current being generated, each of the common voltage output terminals 310 of the common voltage output section 31 adopts a floating (high impedance) state, and each of the segment voltage output terminals 320 of the segment voltage output section 32 adopts a floating (high impedance) state.

Namely, at the timing of frame inversion or frame switching, each of the common voltage output terminals 310 of the common voltage output section 31 is disconnected from both the input terminals 311 and 312, and adopts a floating (high impedance) state. The output of the high level voltage VPC and the low level voltage VNC is accordingly stopped. Similarly, at the timing of frame inversion or the timing of the frame switching, each of the segment voltage output terminals 320 of the segment voltage output section 32 is disconnected from both the input terminals 321 and 322, and adopts a floating (high impedance) state. The output of the high level voltage VPS and the low level voltage VNS is accordingly stopped.

FIG. 7 is a timing chart illustrating states of the common control signal $S_{COM}$ [2:0] (common control signals $S_{COM}$ [0]_1, $S_{COM}$ [0]_2, $S_{COM}$ [1]_1, $S_{COM}$ [1]_2, $S_{COM}$ [2]_1, and $S_{COM}$ [2]_2), and corresponds to the timing chart illustrated in FIG. 6.

Over the ½ clock periods (a total of 1 clock period) immediately preceding and following transition of the signal level of the common inversion signal pol_c, the controller 10 makes the signal level of the common control signals $S_{COM}$ [0]_1, $S_{COM}$ [1]_1, and $S_{COM}$ [2]_1, for supply to the gates of the P-MOS transistors 300PC, 301PC, 302PC of the common voltage output section 31, high level, and makes the signal level of the common control signals $S_{COM}$ [0]_2, $S_{COM}$ [1]_2, and $S_{COM}$ [2]_2, for supply to the gates of the N-MOS transistors 300NC, 301NC, 302NC of the common voltage output section 31, low level. The P-MOS transistors 300PC, 301PC, 302PC and the N-MOS transistors 300NC, 301NC, 302NC thereby adopt an OFF state all at once. Each of the common voltage output terminals 310 of the common voltage output section 31 is thereby disconnected from both the input terminals 311 and 312, and adopts a floating (high impedance) state. Namely, output of the common voltages $V_{COM0}$, $V_{COM1}$ and $V_{COM2}$ is stopped over the ½ clock periods (a total of 1 clock period) immediately preceding and following transition of the signal level of the common inversion signal pol_c. Note that each of the pixels of the liquid crystal panel maintain the level of voltage that has just been applied for a certain period of time, and so there is little impact to image quality even if the common voltage output terminals 310 temporarily adopt a floating (high impedance) state.

This thereby enables the effects of shoot-through current generated in the common power source section 21 to be prevented from impacting the common voltages $V_{COM0}$, $V_{COM1}$ and $V_{COM2}$ by disconnecting the common voltage output terminals 310 of the common voltage output section 31 from both the input terminals 311 and 312 at the frame inversion and frame switching timings. Namely, the semiconductor device 1 according to the present exemplary embodiment is able to suppress abnormal display from occurring in the liquid crystal panel 500, without the considerable man-hours and cost that would be required for timing regulation in order to prevent generation of shoot-through current itself.

Moreover, by synchronizing the frame inversion and frame switching timings, and the timings at which the common voltage output terminals 310 adopt a floating (high impedance) state, with a common clock signal clk, the common voltage output terminals 310 readily adopt a floating (high impedance) state at timings to match the frame inversion and frame switching timings.

Note that although in the present exemplary embodiment the common voltage output terminals 310 adopt a floating (high impedance) state over the ½ clock periods (a total of 1 clock period) immediately preceding and following transition of the signal level of the common inversion signal pol_c, there is no limitation to such an embodiment. The period in which common voltage output terminals 310 adopt a floating (high impedance) state may be any period set so as to encompass the period from start to finish of switching ON or OFF of each of the transistors in the common power source section 21. Due to the common voltage output terminals 310 adopting a floating (high impedance) state over the periods immediately preceding and following transition of the signal level of the common inversion signal pol_c, the present exemplary embodiment is able to reliably prevent the effects of shoot-through current from impacting the common voltages $V_{COM0}$, $V_{COM1}$ and $V_{COM2}$.

Similarly, over the ½ clock periods (a total of 1 clock period) immediately preceding and following transition of the signal level of the segment inversion signal pol_s, the controller 10 makes the signal level of the segment control signals $S_{SEG}$ [0]_1, $S_{SEG}$ [1]_1, . . . , and $S_{SEG}$ [49]_1 for supply to the gates of the P-MOS transistors 300PS, 301PS, . . . , 349PS of the segment voltage output section 32, high level, and makes the signal level of the segment control signals $S_{SEG}$ [0]_2, $S_{SEG}$ [1]_2, . . . , and $S_{SEG}$ [49]_2 for supply to the gates of the N-MOS transistors 300NS, 301NS, . . . , 349NS of the segment voltage output section 32, low level (not illustrated in the drawings). The P-MOS transistors 300PS, 301PS, . . . , 349PS and the N-MOS transistors 300NS, 301NS, . . . , 349NS thereby adopt an OFF state all at once. Each of the segment voltage output terminals 320 of the segment voltage output section 32 is thereby disconnected from both the input terminals 321 and 322, and adopts a floating (high impedance) state. Namely, output of the segment voltages $V_{SEG0}$, $V_{SEG1}$, . . . , and $V_{SEG49}$ is stopped over the ½ clock periods (a total of 1 clock period) immediately preceding and following transition of the signal level of the segment inversion signal pol_s. Note that each of the pixels of the liquid crystal panel maintain the level of voltage that has just been applied for a certain period of time, and so there is little impact on image quality even if the segment voltage output terminals 320 temporarily adopt a floating (high impedance) state.

This thereby enables the effects of shoot-through current generated in the segment power source section 22 to be prevented from impacting the segment voltages $V_{SEG0}$, $V_{SEG1}$, . . . , and $V_{SEG49}$, due to each of the segment voltage output terminals 320 of the segment voltage output section 32 being disconnected from both the input terminals 321 and 322 at the frame inversion and frame switching timings. It is possible to suppress generation of abnormal display in the liquid crystal panel 500. Namely, the semiconductor device 1 according to the present exemplary embodiment is able to suppress abnormal display from occurring in the liquid crystal panel 500, without the considerable man-hours and cost that would be required for timing regulation in order to prevent generation of shoot-through current itself.

Moreover, by synchronizing the frame inversion and frame switching timings, and the timings at which the segment voltage output terminals 320 adopt a floating (high impedance) state, with a common clock signal clk, the segment voltage output terminals 320 readily adopt a floating (high impedance) state at timings to match the frame inversion and frame switching timings.

Note that although in the present exemplary embodiment the segment voltage output terminals 320 adopt the floating (high impedance) state over the ½ clock periods (a total of 1 clock period) immediately preceding and following transition of the signal level of the segment inversion signal pol_s, there is no limitation to such an embodiment. The period in which segment voltage output terminals 320 adopt a floating (high impedance) state may be set so as to include the period from the start to the finish of switching ON or OFF of each of the transistors in the segment power source section 22. Due to the segment voltage output terminals 320 adopting the floating (high impedance) state over the periods immediately preceding and following transition of the signal level of the segment inversion signal pol_s, the present exemplary embodiment is able to reliably prevent the effects of shoot-through current impacting the segment voltages $V_{SEG0}$, $V_{SEG1}$, ..., and $V_{SEG49}$.

As explained above, the semiconductor device 1 according to the present exemplary embodiment enables abnormal display caused by shoot-through current to be suppressed from occurring, even though it is difficult to completely prevent the generation of shoot-through current itself.

In the present exemplary embodiment, an example has been illustrated of the semiconductor device 1 configured by both a unit including the common power source section 21 and the common voltage output section 31, and a unit including the segment power source section 22 and the segment voltage output section 32. However, the semiconductor device 1 may include one of these units alone.

Moreover, although in the present exemplary embodiment an example has been illustrated of a configuration in which the common voltage output section 31 and the segment voltage output section 32 have plural voltage output terminals, it is sufficient for the common voltage output section 31 and the segment voltage output section 32 to be configured with at least one voltage output terminal.

The common power source section 21 is an example of a first power source section of the present disclosure. The common voltage output section 31 is an example of a first output section of the present disclosure. The controller 10 is an example of a controller of the present disclosure. The common inversion signal pol_c and the segment inversion signal pol_s are examples of a first signal of the present disclosure. The output terminal 241 of the common power source section 21 is an example of a first power source output terminal of the present disclosure. The output terminal 242 of the common power source section 21 is an example of a second power source output terminal of the present disclosure. The common voltage output terminals 310 are examples of first voltage output terminals of the present disclosure. The common control signals $S_{COM}[0]\_1$, $S_{COM}[1]\_1$, and $S_{COM}[2]\_1$ are examples of a second signal of the present disclosure. The common control signals $S_{COM}[0]\_2$, $S_{COM}[1]\_2$, and $S_{COM}[2]\_2$ are examples of a third signal of the present disclosure. The P-MOS transistors 300PC, 301PC, 302PC are examples of first output stage switches of the present disclosure. The N-MOS transistors 300NC, 301NC, 302NC are examples of second output stage switches of the present disclosure.

The P-MOS transistor 211 is an example of a first power source switch of the present disclosure. The P-MOS transistor 212 is an example of a second power source switch of the present disclosure. The P-MOS transistor 213 is an example of a third power source switch of the present disclosure. The P-MOS transistor 214 is an example of a fourth power source switch of the present disclosure. The timing regulation circuit 203, the inverters 201, 202, 210, and the level shifters 208, 209 are examples of a switching control section of the present disclosure. The timing regulation circuit 203 is an example of a timing regulation circuit of the present disclosure. The first signal generator 11 is an example of a first signal generator of the present disclosure. The second signal generator 12 is an example of a second signal generator of the present disclosure.

The segment power source section 22 is an example of a second power source section of the present disclosure. The segment voltage output section 32 is an example of a second output section of the present disclosure. The output terminal 251 of the segment power source section 22 is an example of a third power source output terminal of the present disclosure. The output terminal 252 of the segment power source section 22 is an example of a fourth power source output terminal of the present disclosure. The segment voltage output terminals 320 are examples of a second voltage output terminal of the present disclosure. The segment control signals $S_{SEG}[0]\_1$, $S_{SEG}[1]\_1$, ..., $S_{SEG}[49]\_1$ are examples of forth signals of the present disclosure. The segment control signals $S_{SEG}[0]\_2$, $S_{SEG}[1]\_2$, ..., $S_{SEG}[49]\_2$ are examples of fifth signals of the present disclosure. The P-MOS transistors 300PS, 301PS, ..., and 349PS are examples of third output stage switches of the present disclosure. The N-MOS transistors 300NS, 301NS, ..., and 349NS are examples of fourth output stage switches of the present disclosure.

What is claimed is:

1. A semiconductor device comprising:
   an input terminal configured to receive as an input an inversion signal that transitions between a low level and a high level;
   a timing regulation circuit configured to output a first output signal and a second output signal that transition between the low level and the high level, the timing regulation circuit configured to
      shift the second output signal from the high level to the low level after shifting the first output signal from the high level to the low level, in a case in which the inversion signal transitions from the low level to the high level, and
      shift the first output signal from the low level to the high level after having shifted the second output signal from the low level to the high level, in a case in which the inversion signal transitions from the high level to the low level; and
   a voltage output section configured to receive the first output signal and the second output signal, and to output a first voltage and a second voltage that is lower than the first voltage.

2. The semiconductor device according to claim 1, wherein the voltage output section is configured to change respective voltage levels of the first voltage and the second voltage according to a transition of the inversion signal between the low level and the high level.

3. A semiconductor apparatus comprising:
   a plurality of segment electrodes and a plurality of common electrodes that are arrayed in a lattice formation;
   a plurality of liquid crystal elements, each of which is disposed at each intersection portion of the segment electrodes and the common electrodes; and
   the semiconductor device according to claim 1 that supplies voltages to each of the segment electrodes and the common electrodes.

* * * * *